(12) United States Patent
Engel et al.

(10) Patent No.: US 10,319,633 B2
(45) Date of Patent: *Jun. 11, 2019

(54) DIFFUSION BARRIER LAYER FORMATION

(71) Applicant: International Business Machines Corporation, Armonk, NY (US)

(72) Inventors: Brett H. Engel, Ridgefield, CT (US); Domingo A. Ferrer, Clifton Park, NY (US); Arun Vijayakumar, Austin, TX (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/164,063

(22) Filed: May 25, 2016

(65) Prior Publication Data

US 2016/0276217 A1   Sep. 22, 2016

Related U.S. Application Data

(63) Continuation of application No. 14/501,137, filed on Sep. 30, 2014.

(51) Int. Cl.
*H01L 21/768* (2006.01)
*H01L 21/285* (2006.01)
(Continued)

(52) U.S. Cl.
CPC .. *H01L 21/76856* (2013.01); *H01L 21/28556* (2013.01); *H01L 21/28562* (2013.01);
(Continued)

(58) Field of Classification Search
CPC ......... H01L 45/1233; H01L 2924/0002; H01L 45/146; H01L 45/1253; H01L 45/08
See application file for complete search history.

(56) References Cited

U.S. PATENT DOCUMENTS 5,565,708 A   10/1996   Ohsaki et al.
5,963,828 A   10/1999   Allman et al.
(Continued)

OTHER PUBLICATIONS

Tran. Notice of Allowance and Fees Due for U.S. Appl. No. 14/501,137, dated Apr. 28, 2016, 18 pages.
(Continued)

*Primary Examiner* — Tony Tran
(74) *Attorney, Agent, or Firm* — Steven J. Meyers; Hoffman Warnick LLC

(57) ABSTRACT

A method of forming a titanium nitride (TiN) diffusion barrier includes exposing a deposition surface to a first pulse of a titanium-containing precursor and to a first pulse of a nitrogen-rich plasma to form a first TiN layer with a first nitrogen concentration making a lower portion of the TiN diffusion barrier, the first nitrogen concentration of the first TiN layer is increased by the first pulse of the nitrogen-rich plasma reducing a reactivity of the lower portion of the TiN diffusion barrier to prevent fluorine diffusion. The first TiN layer is exposed to second pulses of the titanium-containing precursor and the nitrogen-rich plasma to form a second TiN layer with a second nitrogen concentration above the first TiN layer making an upper portion of the TiN diffusion barrier, the first pulse of the nitrogen-rich plasma has a substantially longer duration than the second pulse of the nitrogen-rich plasma.

8 Claims, 9 Drawing Sheets

(51) Int. Cl.
*H01L 23/485* (2006.01)
*H01L 23/532* (2006.01)

(52) U.S. Cl.
CPC .. *H01L 21/28568* (2013.01); *H01L 21/76841* (2013.01); *H01L 21/76843* (2013.01); *H01L 21/76858* (2013.01); *H01L 21/76862* (2013.01); *H01L 21/76867* (2013.01); *H01L 21/76876* (2013.01); *H01L 21/76895* (2013.01); *H01L 23/485* (2013.01); *H01L 23/53266* (2013.01); *H01L 2924/0002* (2013.01)

(56) References Cited

U.S. PATENT DOCUMENTS

| | | | |
|---|---|---|---|
| 6,455,419 B1 * | 9/2002 | Konecni | H01L 21/76843 257/E23.163 |
| 6,756,318 B2 | 6/2004 | Nguyen et al. | |
| 6,828,233 B2 | 12/2004 | Leiphart | |
| 7,041,595 B2 | 5/2006 | Chopra | |
| 7,407,875 B2 | 5/2008 | Wong et al. | |
| 7,727,882 B1 | 6/2010 | Wu et al. | |
| 9,847,251 B2 | 12/2017 | Engel et al. | |
| 10,170,359 B2 | 1/2019 | Engel et al. | |
| 2003/0054628 A1 | 3/2003 | Leng et al. | |
| 2003/0143841 A1 | 7/2003 | Yang et al. | |
| 2007/0066060 A1 | 3/2007 | Wang | |
| 2010/0151676 A1 * | 6/2010 | Ritchie | C23C 16/34 438/660 |
| 2016/0093526 A1 | 3/2016 | Engel et al. | |

OTHER PUBLICATIONS

Non-Final Office Action for U.S. Appl. No. 15/164,071, dated Dec. 7, 2016, 15 pages.
Notice of Allowance for U.S. Appl. No. 15/164,071, dated Aug. 4, 2017, 11 pages.
Final Office Action for U.S. Appl. No. 15/164,071, dated Apr. 17, 2017, 16 pages.
U.S. Appl. No. 15/797,791, Notice of Allowance dated Sep. 26, 2018, 13 pages.

* cited by examiner

DIFFUSION BARRIER LAYER FORMATION

BACKGROUND

The present invention generally relates to semiconductor manufacturing and more particularly to a method of forming a titanium nitride diffusion barrier layer in middle-of-the-line (MOL) contacts.

In semiconductor technologies, tungsten (W) is typically used as a middle-of-the-line (MOL) contact material mainly because of its relatively low resistance, reduced stress, and electro-migration properties. A MOL contact may be a conductive stud working as an interface between contact areas of an active semiconductor device (or integrated circuit), which may be referred to as front-end-of-the-line (FEOL), and overlying interconnects structures, which may be referred to as back-end-of-the-line (BEOL). MOL contacts may extend to surfaces of contact areas of underlying semiconductor devices. The contact areas of an active semiconductor device may be made of, for example, a silicide material. MOL contacts are usually formed in a layer of dielectric material deposited on top of the active semiconductor device. A plurality of trenches or openings may be formed in the layer of dielectric material to form the MOL contacts.

SUMMARY

According to an embodiment of the present disclosure, a method of forming a titanium nitride diffusion barrier may include exposing a deposition surface to a first pulse of a titanium-containing precursor gas to initiate a nucleation of the titanium nitride diffusion barrier in the deposition surface, the deposition surface may include sidewalls and a bottom of a contact opening, exposing the deposition surface to a first pulse of a nitrogen-rich plasma to form a first titanium nitride layer with a first nitrogen concentration in the deposition surface, the first titanium nitride layer may include a lower portion of the titanium nitride diffusion barrier, the first nitrogen concentration of the first titanium nitride layer may be substantially increased by the first pulse of the nitrogen-rich plasma, the increased nitrogen concentration of the first titanium nitride layer may lower a reactivity of the lower portion of the titanium nitride diffusion barrier to prevent fluorine diffusion, exposing the first titanium nitride layer to a second pulse of the titanium-containing precursor gas to continue the nucleation of the titanium nitride diffusion barrier, and exposing the first titanium nitride layer to a second pulse of the nitrogen-rich plasma to form a second titanium nitride layer with a second nitrogen concentration directly above and in contact with the first titanium nitride layer, the second titanium nitride layer may include an upper portion of the titanium nitride diffusion barrier, the first pulse of the nitrogen-rich plasma may have a substantially longer duration than the second pulse of the nitrogen rich plasma, the titanium nitride diffusion barrier may include the first and the second titanium nitride layers.

According to another embodiment of the present disclosure, a method of forming a titanium nitride diffusion barrier may include exposing a deposition surface to a pulse of a titanium-containing precursor gas to initiate a nucleation of the titanium nitride diffusion barrier in the deposition surface, the deposition surface may include sidewalls and a bottom of a contact opening, exposing the deposition surface to a first pulse of a nitrogen-rich plasma to form a first titanium nitride layer with a first nitrogen concentration in the deposition surface, exposing the first titanium nitride layer to a second pulse of the nitrogen-rich plasma to form a second titanium nitride layer with a second nitrogen concentration directly above and in contact with the first titanium nitride layer, exposing the second titanium nitride layer to a third pulse of the nitrogen-rich plasma to form a third titanium nitride layer with a third nitrogen concentration directly above and in contact with the second titanium nitride layer, and exposing the third titanium nitride layer to a fourth pulse of the nitrogen-rich plasma to form a fourth titanium nitride layer with a fourth nitrogen concentration directly above and in contact with the third titanium nitride layer. The first, second, third, and fourth titanium nitride layers may form a multi-layer titanium nitride diffusion barrier exhibiting gradually decreasing levels of fluorine diffusivity, the fluorine diffusivity of the first, second, third, and fourth titanium nitride layers may be inversely proportional to a duration of the first, second, third, and fourth pulses of nitrogen-rich plasma and to a nitrogen concentration of the first, second, third, and fourth titanium nitride layers.

According to another embodiment of the present disclosure, a method of forming a titanium nitride diffusion barrier may include exposing a deposition surface to a pulse of a titanium-containing precursor gas to initiate a nucleation of the titanium nitride diffusion barrier in the deposition surface, the deposition surface may include sidewalls and a bottom of a contact opening, exposing the deposition surface to a first pulse of a nitrogen-rich plasma to form a first titanium nitride layer with a first nitrogen concentration in the deposition surface, exposing the first titanium nitride layer to a second pulse of the nitrogen-rich plasma to form a second titanium nitride layer with a second nitrogen concentration directly above and in contact with the first titanium nitride layer, exposing the second titanium nitride layer to a third pulse of the nitrogen-rich plasma to form a third titanium nitride layer with a third nitrogen concentration directly above and in contact with the second titanium nitride layer, and exposing the third titanium nitride layer to a fourth pulse of the nitrogen-rich plasma to form a fourth titanium nitride layer with a fourth nitrogen concentration directly above and in contact with the third titanium nitride layer. The first, second, third, and fourth titanium nitride layers may form a multi-layer titanium nitride diffusion barrier exhibiting gradually decreasing levels of fluorine diffusivity, the fluorine diffusivity, of the first, second, third, and fourth titanium nitride layers may be inversely proportional to a duration of the first, second, third, and fourth pulses of nitrogen-rich plasma and to a nitrogen concentration of the first, second, third, and fourth titanium nitride layers.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
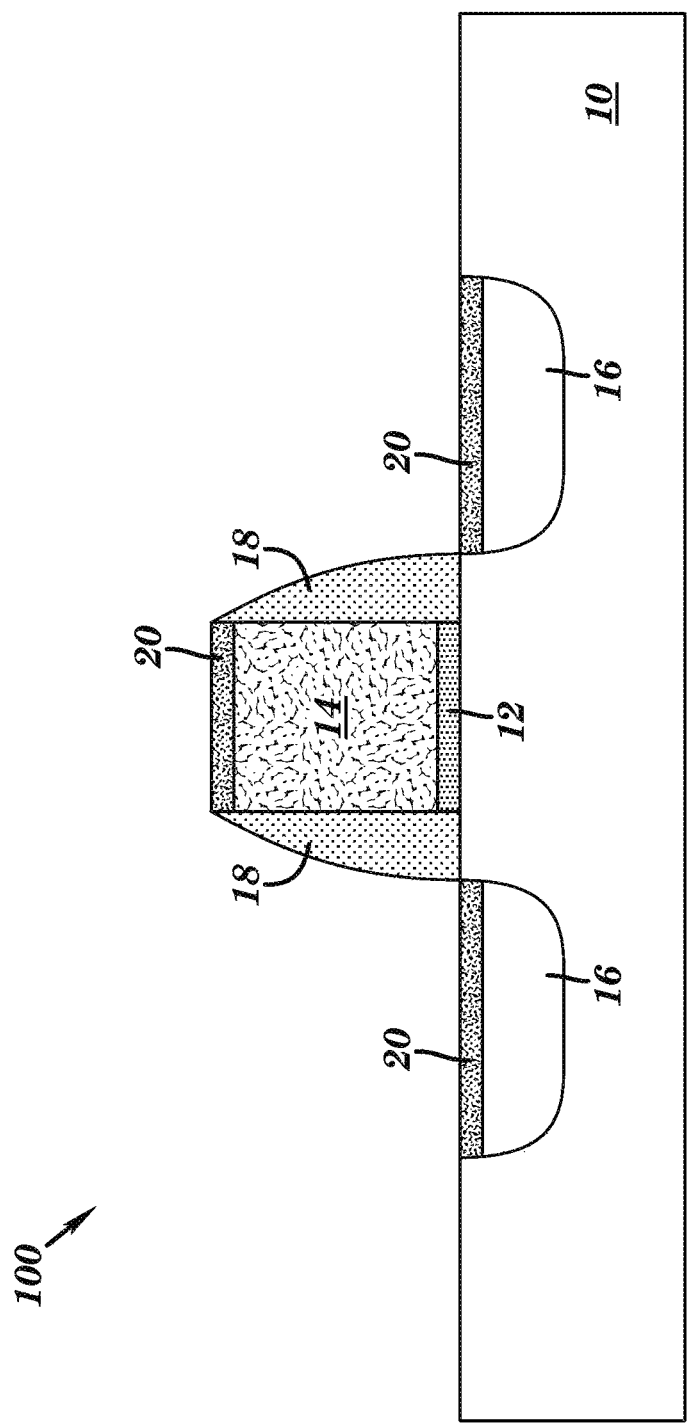
FIG. 1 is a cross-sectional view of a semiconductor structure, according to an embodiment of the present disclosure.

Detailed embodiments of the claimed structures and methods are disclosed herein; however, it may be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention. It will be understood that when an element as a layer, region, or substrate is referred to as being "on" or "over" another element, it may be directly on the other element or intervening elements may also be present. In contrast, when an element is referred to as being "directly on" or "directly over" another element, there are no intervening elements present. It will also be understood that when an element is referred to as being "beneath," "below," or "under" another element, it may be directly beneath or under the other element, or intervening elements may be present. In contrast, when an element is referred to as being "directly beneath" or "directly under" another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Tungsten (W) is the preferred material for forming middle-of-the-line (MOL) contacts, mainly due to its low resistivity, remarkable conformality for tungsten hexafluoride-based chemical vapor deposition processes and thermodynamic stability. Generally, forming an adhesion layer in the contact trench may be necessary prior to tungsten deposition. The adhesion layer is commonly a titanium nitride (TiN) layer. This titanium nitride layer may also act as a barrier to stop fluorine diffusion to an underlying titanium film. The underlying titanium film may be typically formed to scavenge native oxide on the silicide contact for lower resistivity and enhanced yield. One difficulty, however, with using tungsten is that fluorine from a tungsten hexafluoride (WF6) precursor used during tungsten deposition may diffuse across the titanium nitride barrier distorting the profile of interconnect structures as result of the unintended reaction between titanium and fluorine that may form a titanium fluoride (Tif 3) compound. The formed titanium fluoride compound may involve a lattice constant expansion that may create a severe overhang of the contact trench. This may cause early pinch off during tungsten deposition, proliferating the so called Hollow CA defectivity. Hollow CA defectivity presents a particular challenge due to yield reduction for 14 nm technology, as may create pervasive Ml opens in back-end-of-the-line (BEOL) levels.

Proposed solutions to the above problem in 20 nm and 14 nm technologies may include substantial (more than 60%) thickening of the titanium nitride diffusion barrier. This may impose a penalty in contact and lateral resistance that may risk both the performance and yield of, for example, finFET architectures as a result of parasitic resistance. Another proposed solution to the above problem may be the use of fluorine-free tungsten (FFW). FFW may enable resistance reduction by replacing titanium nitride with organometallic tungsten nitride. Nevertheless, the adhesion of bulk tungsten to FFW barrier may be compromised as result of chemical mechanical polish (CMP) slurry corrosion and nucleation delay for tungsten chemical vapor deposition (CVD).

Therefore, by incorporating a tunable nitrogen-rich plasma pulse to control a nitrogen stoichiometry of a titanium nitride film during an atomic layer deposition (ALD) process, embodiments of the present disclosure may, among other potential benefits, form an enhanced titanium nitride diffusion barrier capable of preventing fluorine diffusion and lowering contact resistance, thereby decreasing hollow CA defectivity in middle-of-the-line (MOL) contacts.

The present invention generally relates to semiconductor manufacturing and more particularly to a method of forming a titanium nitride diffusion barrier in MOL contacts. One way to form the titanium nitride diffusion barrier may include using several nitrogen-rich plasma pulses of different duration during an atomic layer deposition (ALD) process. Embodiments by which to form the titanium nitride diffusion barrier are described in detail below by referring to the accompanying drawings in FIGS. 7-9.

Referring now to FIG. 1, a semiconductor structure 100 may be formed or provided, according to an embodiment of the present disclosure. In the depicted embodiment, the semiconductor structure 100 may be, for example, a field effect transistor (PET) device. However, the semiconductor structure 100 may also include other semiconductor devices such as, for example, capacitors, diodes, bipolar transistors, BiCMOS devices, memory devices and the like.

The semiconductor structure 100 may be fabricated by any semiconductor processing technique known in the art including, but not limited to, deposition, lithography, etching, and ion implantation techniques. The semiconductor structure 100 may be formed on a substrate 10. In this embodiment, the substrate 10 may be a bulk semiconductor substrate which may be made from any of several known semiconductor materials such as, for example, silicon, germanium, silicon-germanium alloy, carbon-doped silicon, carbon-doped silicon-germanium alloy, and compound (e.g. III-V and II-VI) semiconductor materials. Non-limiting examples of compound semiconductor materials include gallium arsenide, indium arsenide, and indium phosphide. In the depicted embodiment, the substrate 10 may be made of silicon.

In other embodiments, the substrate 10 may be, for example, a semiconductor-on-insulator (SOI) substrate, where a buried insulator layer separates a base substrate from a top semiconductor layer. The components of the semiconductor structure 100, may then be formed in the top semiconductor layer.

At this step of the manufacturing process, the semiconductor 100 may be completed with a gate dielectric 12, a gate electrode 14, gate spacers 18, source-drain regions 16 and contact areas 20. It should be understood by a person skilled in the art that the semiconductor structure 100 may be fabricated using either a replacement metal gate (RMG) or gate last process flow, or a gate first process flow.

The gate dielectric 12 may include any suitable insulating material such as, for example, oxide, nitride, oxynitride or silicate including metal silicates and nitrided metal silicates. In one embodiment, the gate dielectric 12 may include an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof. The gate dielectric 12 may be formed by any suitable deposition technique known in the art, including chemical vapor deposition (CVD), plasma-assisted CVD, atomic layer deposition (ALD), evaporation, reactive sputtering, chemical solution deposition or other like deposition processes. The physical thickness of the gate dielectric 12 may vary, but typically may have a thickness ranging from about 0.5 nm to about 10 nm. More preferably the gate dielectric 12 may have a thickness ranging from about 0.5 nm to about 3 nm.

The gate electrode 14 may be formed above the gate dielectric 12. The gate electrode 14 may include, for example, Zr, W, Ta, Hf, Ti, Al, Ru, Pa, metal oxide, metal carbide, metal nitride, transition metal aluminides (e.g. $Ti_3Al$, $ZrAl$), TaC, TiC, TaMgC, and any combination of those materials. In one embodiment, the gate electrode 14 may include tungsten (W). The gate electrode 14 may be deposited by any suitable technique known in the art, for example by ALD, CVD, physical vapor deposition (PVD), molecular beam deposition (MBD), pulsed laser deposition (PLD), or liquid source misted chemical deposition (LSMCD).

The gate spacers 18 may be formed on opposite sidewalls of the gate electrode 14. The gate spacers 18 may be made from an insulator material such as an oxide, nitride, oxynitride, silicon carbon oxynitride, silicon boron oxynitride, low-k dielectric, or any combination thereof. In one embodiment, the gate spacers 18 may be made from a nitride and may be formed by conventional deposition and etching techniques. In various embodiments, the gate spacers 18 may include one or more layers. It should be understood that while the gate spacers 18 are herein described in the plural, the gate spacers 18 may consist of a single spacer surrounding the gate electrode 14.

The source-drain regions 16 may be formed in the substrate 10 adjacent to the gate spacers 18 on opposite sides of the gate electrode 14. Numerous methods of forming source-drain regions are known in the art, any of which may be used to form the source-drain regions 16. In some embodiments, the source-drain regions 16 may be formed by doping portions of the substrate 10. In other embodiments, the source-drain regions 16 may be formed by growing epitaxial semiconductor regions within trenches formed in the substrate 10 on opposite sides of the gate electrode 14. The epitaxial semiconductor regions may extend above and/or below a top surface of the substrate 10.

In the depicted embodiment, the semiconductor structure 100 may also include one or more contact areas 20 that may be formed atop of the source-drain regions 16 and the gate electrode 14. Contact areas 20 may include a silicide material such as, for example, NiSi, CoSh, TiSi, and WSix. The contact areas 20 may be formed by any silicidation process known in the art. In some embodiments, the contact areas 20 may not exist at this point of the manufacturing process.

Figure 2:
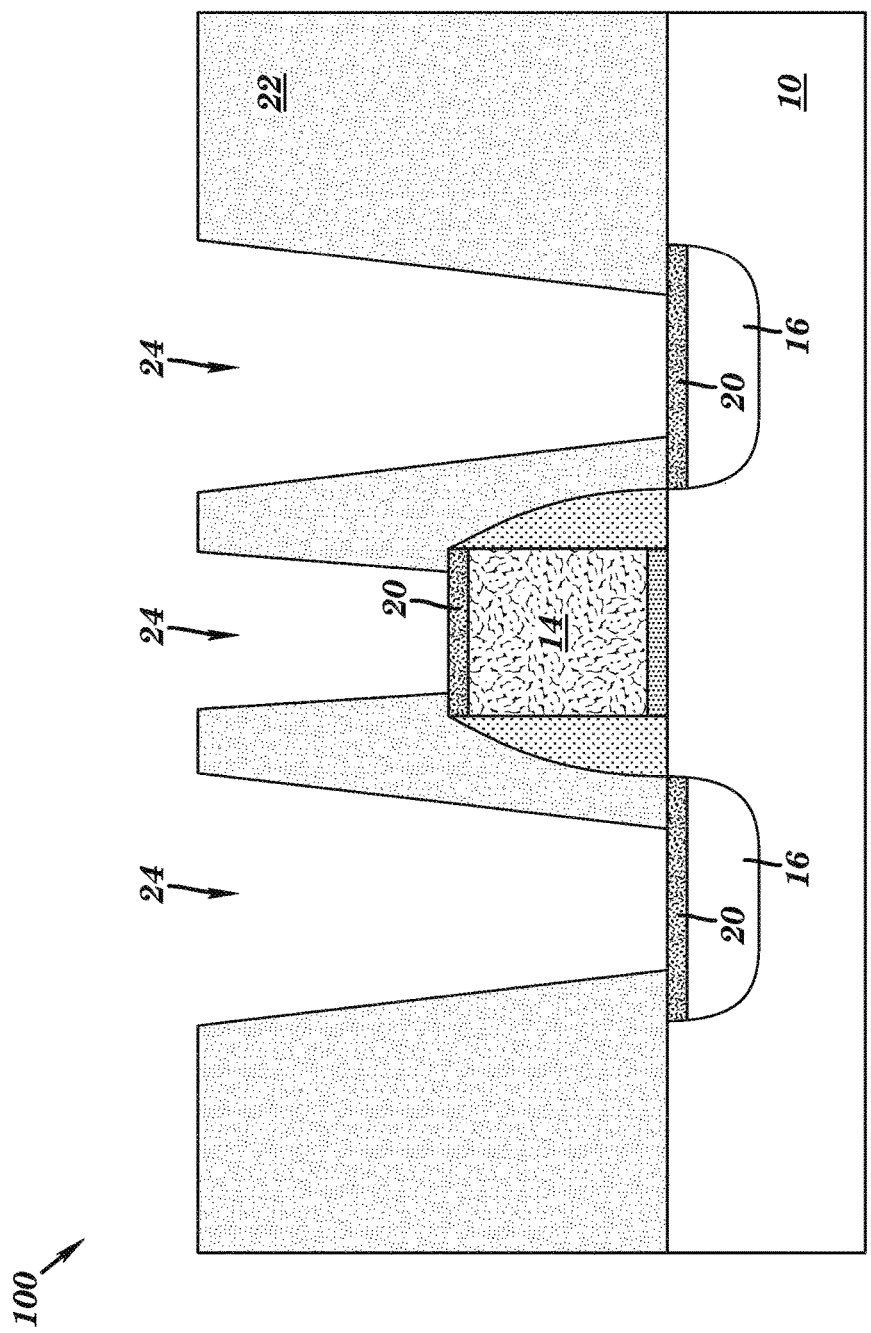
FIG. 2 is a cross-sectional view of the semiconductor structure depicting forming contact openings, according to an embodiment of the present disclosure.

Referring now to FIG. 2, a dielectric layer 22 may be formed above the substrate 10, source-drain regions 16 and gate electrode 14, according to an embodiment of the present disclosure. The dielectric layer 22 may include any dielectric material including, for example, silicon oxide, silicon nitride, hydrogenated silicon carbon oxide, silicon based low-k dielectrics, flowable oxides, porous dielectrics, or organic dielectrics including porous organic dielectrics and may be formed by any deposition method known in the art, for example, by CVD of the dielectric material.

A plurality of openings 24 (hereinafter "contact openings") may be patterned and formed in the dielectric layer 22. The contact openings 24 may extend through the dielectric layer 22 exposing a top surface of the contact areas 20. In embodiments in which the contact areas 20 have not been formed, etching of the contact openings 24 may expose top surfaces of the source-drain regions 16 and a top surface of the gate electrode 14. The contact openings 24 may be formed in the dielectric layer 22 by any etching technique known in the art, such as, for example, reactive-ion-etching (RIE). The contact openings 24 may be substantially vertical or may a tapered profile as depicted in FIG. 2.

At this step of the manufacturing process, the exposed top surface of the contact areas 20 as well as sidewalls of the contact openings 24 may be subjected to a treatment process which may be capable of removing any surface oxide or etch residue that may be present thereon. In one embodiment, argon (Ar) sputtering and/or contacting with a chemical etchant may be used to remove any surface oxide or etch residue from the contact areas 20. It should be noted that although widening of the contact openings 24 may occur during this step, it may be negligible and may not affect device performance.

Figure 3:
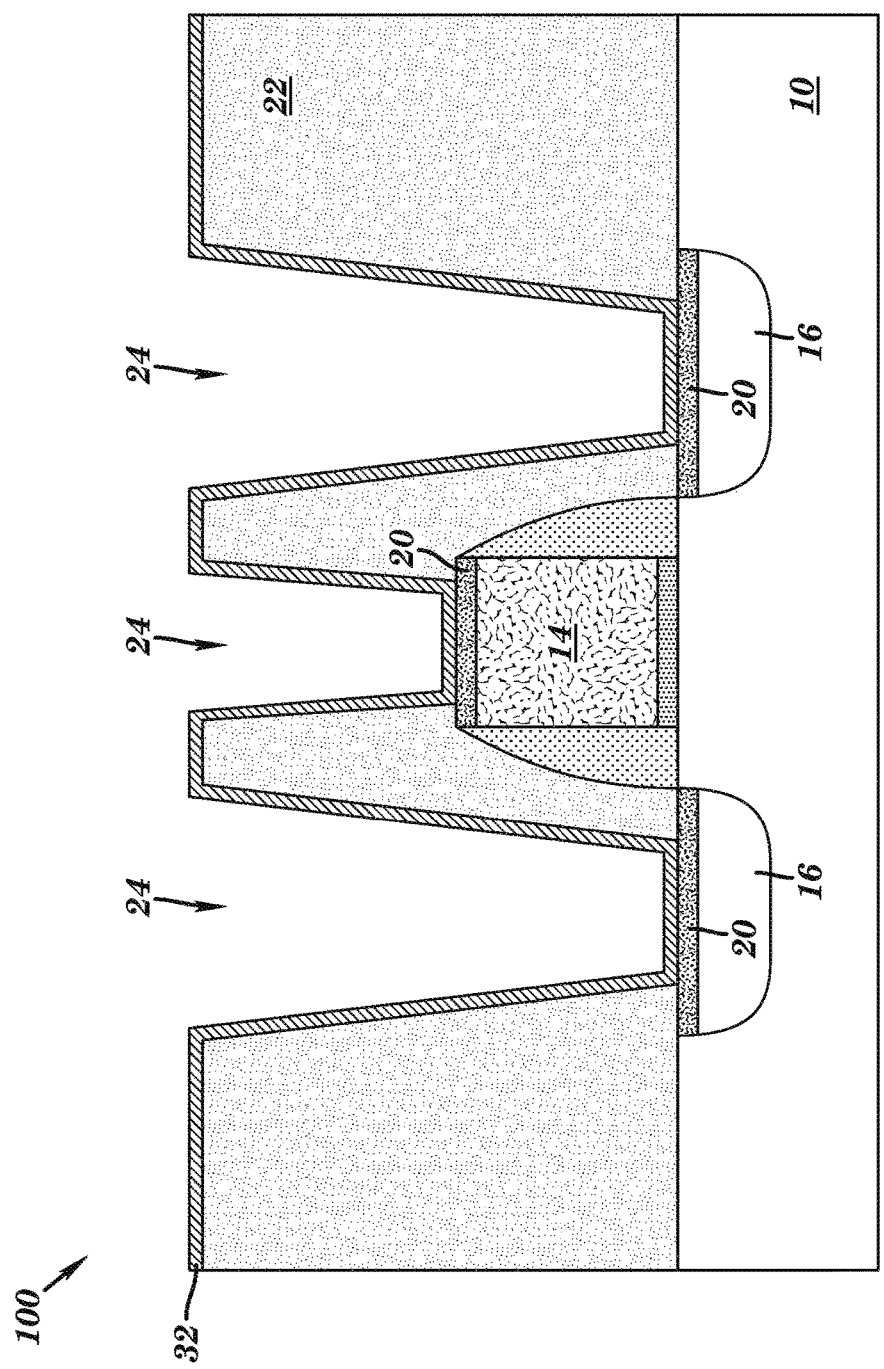
FIG. 3 is a cross-sectional view of the semiconductor structure depicting forming an oxygen-getter layer, according to an embodiment of the present disclosure.

Referring now to FIG. 3, an oxygen-getter layer 32 may be conformally deposited in the contact openings 24, according to an embodiment of the present disclosure. The oxygen-getter layer 32 may scavenge native oxide on the contact areas 20 for lower contact resistivity and enhanced yield. The oxygen-getter layer 32 may substantially cover a perimeter of the contact openings 24. More specifically, the oxygen-getter layer 32 may substantially cover a sidewall and a bottom of the contact openings 24. The oxygen-getter layer 32 may also cover upper surfaces of the dielectric layer 22 as depicted. The oxygen-getter layer 32 may form an interface between the bottom of the contact openings 24 and the contact areas 20 of the semiconductor structure 100. The oxygen-getter layer 32 may include titanium (Ti), tungsten (W), tantalum (Ta), or any other material that has a high affinity for oxygen. In a preferred embodiment, the oxygen-getter layer 32 may be formed by physical vapor deposition (PVD) of a titanium film. The thickness of the oxygen-getter layer 32 may vary depending on the conducted deposition process as well as the material used. In some embodiments, the oxygen-getter layer 32 may have a thickness ranging from approximately 2 nm to approximately 40 nm. It should be noted that although the oxygen-getter layer 32 is depicted in the figures as one layer, it may be composed of several layers of materials exhibiting high affinity for oxygen.

Figure 4:
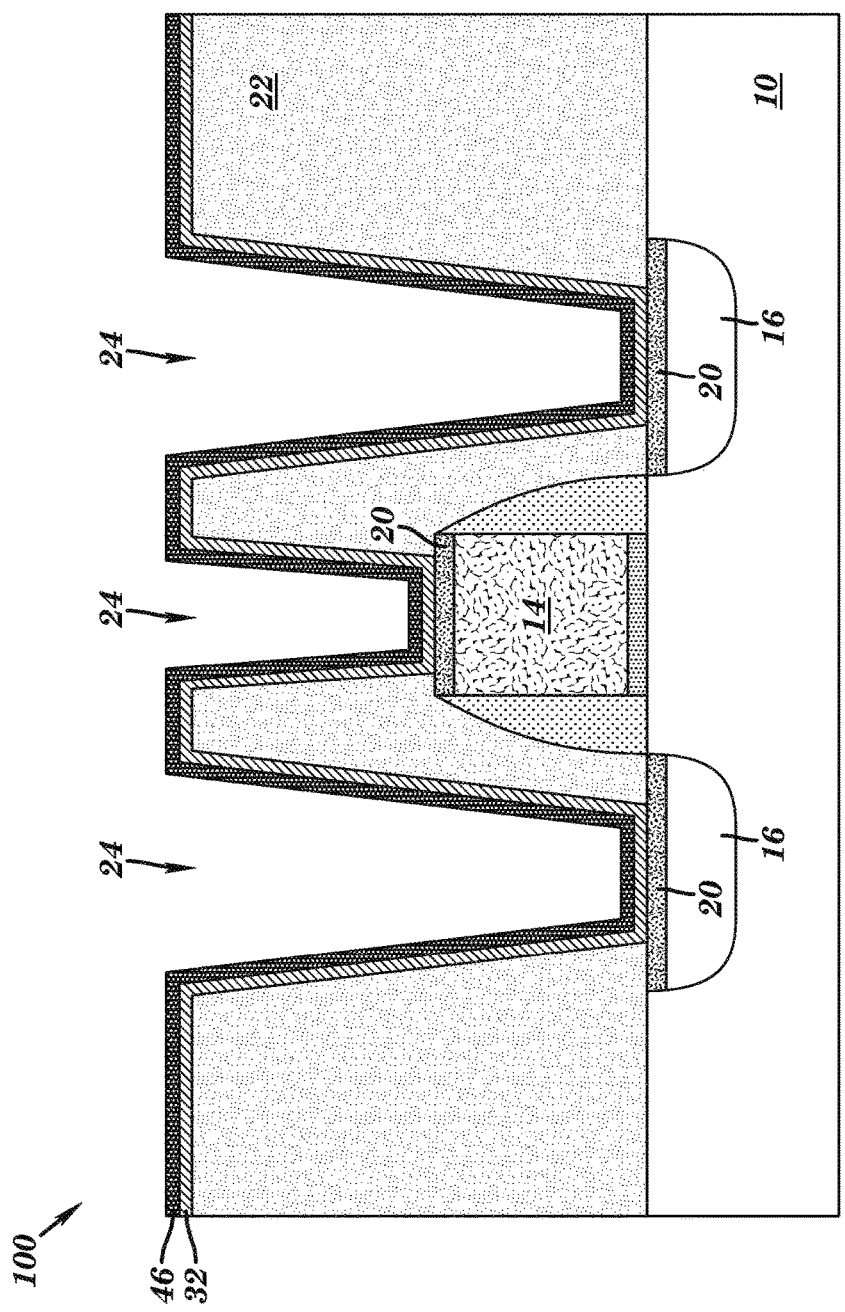
FIG. 4 is a cross-sectional view of the semiconductor structure depicting forming a diffusion barrier layer, according to an embodiment of the present disclosure.

Referring now to FIG. 4, a diffusion barrier 46 may be conformally deposited in the contact openings 24 above and in direct contact with the oxygen-getter layer 32, according to an embodiment of the present disclosure. The diffusion barrier 46 may prevent fluorine diffusion from a tungsten hexafluoride (WF6) precursor subsequently used during tungsten (W) deposition. In one embodiment, the diffusion barrier 46 may consist of a titanium nitride (TiN) film.

In current MOL contact formation techniques, the diffusion barrier 46 may be deposited by atomic layer deposition (ALD) of a titanium nitride film. Formation of the titanium nitride film using ALD may include advantages over CVD or PVD processes such as, for example, ultra-thin film growth, thickness control, minimal impurity content, low process temperature, conformal deposition, and thickness uniformity. A self-limited mechanism may control surface reactions by which the titanium nitride film may grow during the ALD process. As a result, the growth rate of the titanium nitride film forming the diffusion barrier 46 may depend on the number of deposition cycles rather than the flow rate of reactant gases and temperature conditions. A tetrakis-dimethyl-amino-titanium (TDMAT) may typically be used as a titanium precursor. The deposition process may generally include alternating pulses of the TDMAT precursor gas and a nitrogen-rich plasma vapor (used as nitrogen precursor) on a deposition surface for subsequent chemisorption of the precursors. Chemisorption, a type of adsorption process, may involve a chemical reaction between the deposition surface (adsorbent) and the precursors (adsorbate) in which new chemical bonds may be formed at the deposition surface, e.g. the sidewalls and bottom of the contact openings 24.

Embodiments by which to form the diffusion barrier 46 are described in detail below with reference to FIGS. 7, 8 and 9.

Figure 5:
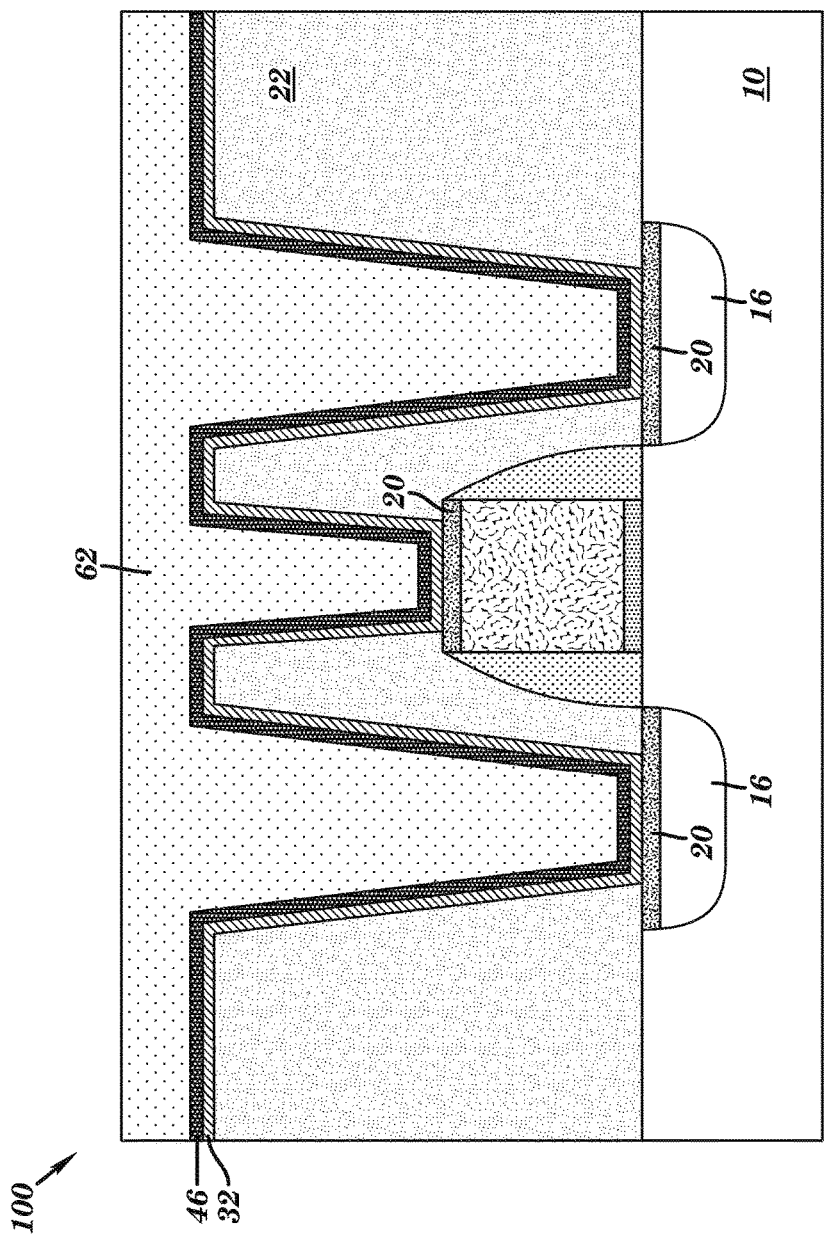
FIG. 5 is a cross-sectional view of the semiconductor structure depicting forming a conductive layer, according to an embodiment of the present disclosure.

Referring now to FIG. 5, a tungsten layer 62 may be deposited in the contact openings 24 (FIG. 4) to form middle-of-the-line (MOL) contacts in the semiconductor structure 100, according to an embodiment of the present disclosure. At this step of the manufacturing process, the contact openings 24 (FIG. 4) may be lined by the oxygen-getter layer 32 and the diffusion barrier 46. The tungsten layer 62 may be formed by any deposition process known in the art, such as, for example, CVD. The tungsten layer 62 may overfill the contact openings 24 (FIG. 4) as depicted in the figure. It should be noted that by following any of the proposed ALD schemes described in FIGS. 7, 8, and 9, a more robust diffusion barrier 46 may be formed to substantially prevent fluorine atoms from the tungsten hexafluoride generally used as tungsten precursor during formation of the tungsten layer 62 to diffuse across the diffusion barrier 46.

Figure 6:
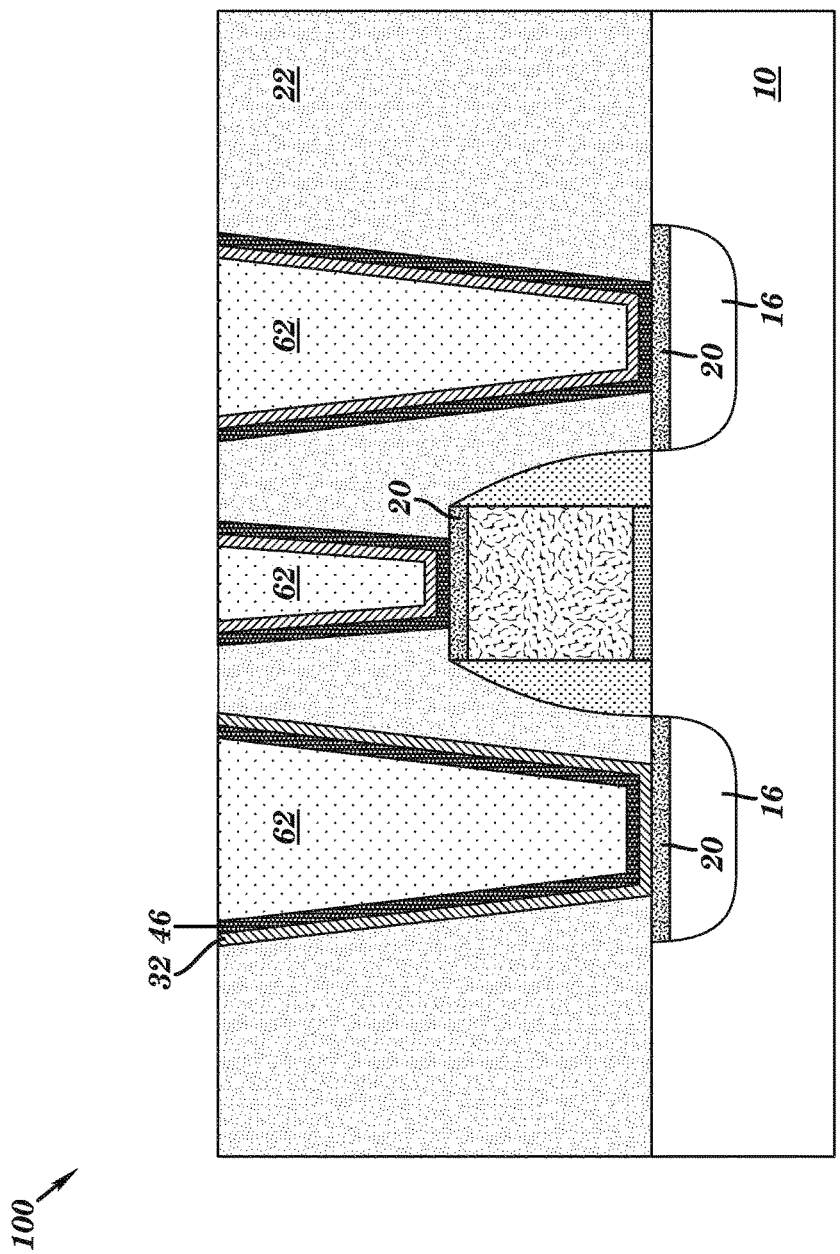
FIG. 6 is a cross-sectional view of the semiconductor structure depicting conducting a planarization process, according to an embodiment of the present disclosure.

Referring now to FIG. 6, a chemical mechanical polishing (CMP) process may be conducted to planarized the tungsten layer 62, eliminating the overfill regions shown in FIG. 5, according to an embodiment of the present disclosure. The portions of the oxygen-getter layer 32 and barrier layer 52 above the dielectric layer 22 may also be removed using, for example, another CMP process. In some embodiments, different chemical slurries may be used during the same CMP process in order to remove excess of the tungsten layer 62 as well as the portions of the oxygen-getter layer 32 and barrier layer 52 above the dielectric layer 22. The CMP process may be conducted until a top surface of the tungsten layer 62 may be substantially flush with a top surface of the dielectric layer 22.

Figure 7:
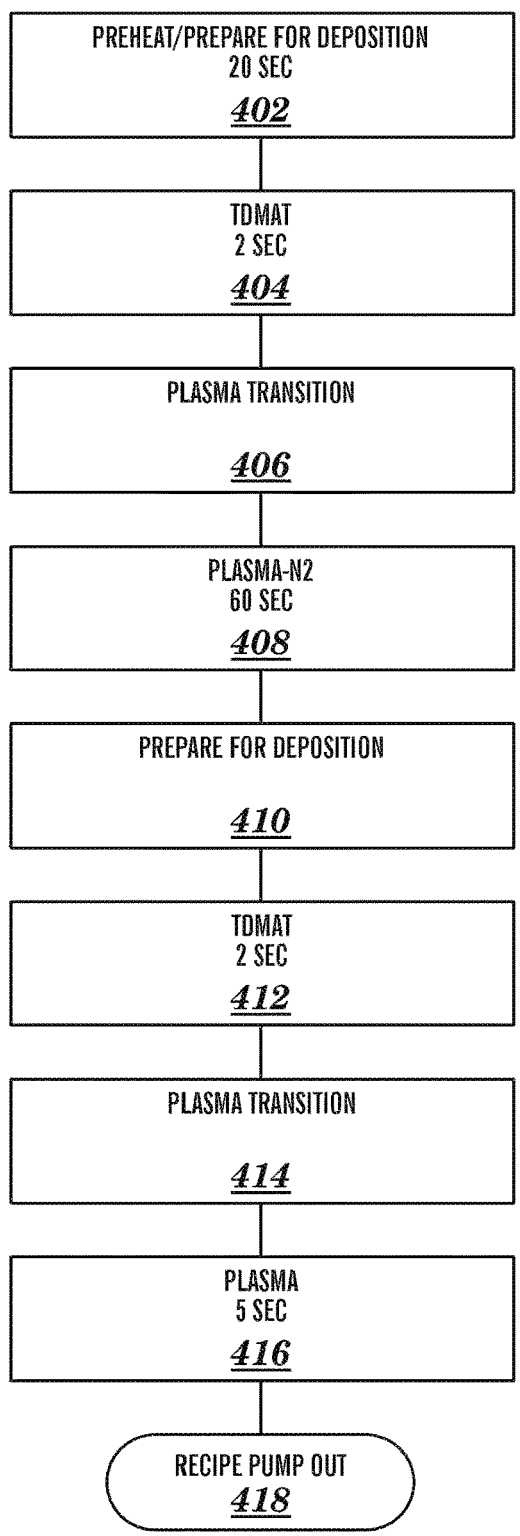
FIG. 7 is a flow chart describing processing steps during an atomic layer deposition process, according to an embodiment of the present disclosure.

Referring now to FIG. 7, a flow chart 400 describing an atomic layer deposition (ALD) scheme for forming the diffusion barrier 46 (FIG. 4) is shown, according to an embodiment of the present disclosure. In this embodiment, the ALD process may begin at step 402 with a pre-heating step that may prepare the deposition surface or substrate to react with and chemisorb the TDMAT precursor gas introduced in the reaction chamber at step 404. The deposition surface may include sidewalls and bottom of the contact openings 24 (FIG. 4). A first pulse of the TDMAT precursor gas at step 404 may have a duration of approximately 2 seconds. At the plasma transition step 406, the reactor may be purged with an inert gas such as argon or helium and may be follow by the plasma step 408 where a first nitrogen-rich plasma pulse of approximately 60 seconds may be released to the deposition surface. It should be noted that a similar plasma transition step may occur between each subsequent cycle of TDMAT precursor gas and nitrogen-rich plasma pulse. This 60 second first nitrogen-rich plasma pulse is longer than nitrogen-rich plasma pulses used in typical ALD processes to intentionally change the nitrogen stoichiometry of the diffusion barrier 46 (FIG. 4). More specifically, the longer the duration of the pulse the higher the nitrogen concentration in the diffusion barrier 46 (FIG. 4) will be. Longer nitrogen-rich plasma pulses are not typical in the art because they may generally be associated to high resistivity titanium nitride films.

A pulse may represent a relatively brief fluid discharge released onto the deposition surface. More specifically, a pulse may include a relatively short and timed injection interval of the TDMAT precursor gas (e.g., 404, 412) and a relatively short and timed injection interval of the nitrogen-rich plasma (e.g., 408, 416) onto the deposition surface during a determined deposition cycle. One deposition cycle may consist of a preheating step to prepare the surface or substrate for deposition (e.g., 402, 410), followed by a pulse of the TDMAT precursor (e.g., 404, 412) and a plasma transition step (e.g., 406, 414) conducted prior to releasing a pulse of the nitrogen-rich plasma (e.g., 408, 416). The duration of each pulse may also be referred to as a length of the pulse.

After the first nitrogen-rich plasma pulse at step 408, a preparation for deposition step 410, substantially similar to the preparation step 402, may be conducted. Next, a second TDMAT precursor gas pulse may be introduced into the reactor at step 412 and released onto the deposition surface. According to the present embodiment, the duration of the second TDMAT precursor gas pulse at step 412 may be substantially similar to the duration of the TDMAT precursor pulse at step 404 (approximately 2 seconds). Subsequently, a plasma transition step 414, substantially similar to the plasma transition step 406, may be conducted prior to the injection of a second nitrogen-rich plasma pulse at step 416. The second pulse of nitrogen-rich plasma pulse at step 416 may be of approximately 5 seconds. It should be noted that, in this embodiment, the first and second TDMAT precursor gas pulses at steps 404 and 412 may have the same duration or length while the nitrogen-rich plasma pulse at step 408 may have a substantially longer duration than the nitrogen-rich plasma pulse at step 416. The ALD process may end with the recipe pump out step 418.

The longer duration (e.g. 60 seconds) of the first nitrogen-rich plasma pulse at step 408 may substantially alter the nitrogen (N2) stoichiometry in the titanium (Ti)/titanium nitride (TiN) interface by modifying the nucleation and densification of the titanium nitride film forming the diffusion barrier 46 (FIG. 4). The resulting diffusion barrier 46 (FIG. 4) may exhibit a reduced reactivity to fluorine owing to the increased nitrogen concentration which may in turn substantially prevent fluorine diffusion and possibly eliminate hollow CA defectivity in MOL contacts. In addition, by increasing the duration of the nitrogen-rich plasma pulse at step 408, nucleation and density of the titanium nitride film may be enhanced enabling fewer deposition cycles and forming a more robust diffusion barrier 46 (FIG. 4) exhibiting substantially lower reactivity to fluorine.

It should be noted that steps 404, 408 and 412, 416 may each represent a single pulse, and that the number and duration of the pulses is directly related to the resulting thickness of the deposited titanium nitride film. Typical ALD processes may include approximately 2-15 pulses of the TDMAT precursor gas and approximately 2-15 pulses of the nitrogen-rich plasma of equal duration or length to secure uniformity of the film. The amount of pulses may depend on the desire thickness of the titanium nitride film. However, the densifying effect of the longer nitrogen-rich pulse at step 408 may allow for a more robust diffusion barrier 46 (FIG. 4) formed in fewer deposition cycles and with a reduced thickness which may in turn decrease contact resistance.

Also, organic residues that may be generally present in plasma-based ALD TiN processes may be substantially removed by increasing the duration of the first nitrogen-rich plasma pulse, removing the organic residues may further reduce the risk of forming amorphous titanium nitride films which may negatively impact the efficiency of the diffusion barrier 46 (FIG. 4). Furthermore, ALD TiN films may usually include oxygen in their composition as a result of the exposure of the films to ambient air. The increased length of the first nitrogen-rich plasma pulse at step 408 may also help tuning the oxidation of the film since it increases the density of the titanium nitride film and the higher the density, the lower the oxidation of the titanium nitride film forming the diffusion barrier 46 (FIG. 4).

Figure 8:
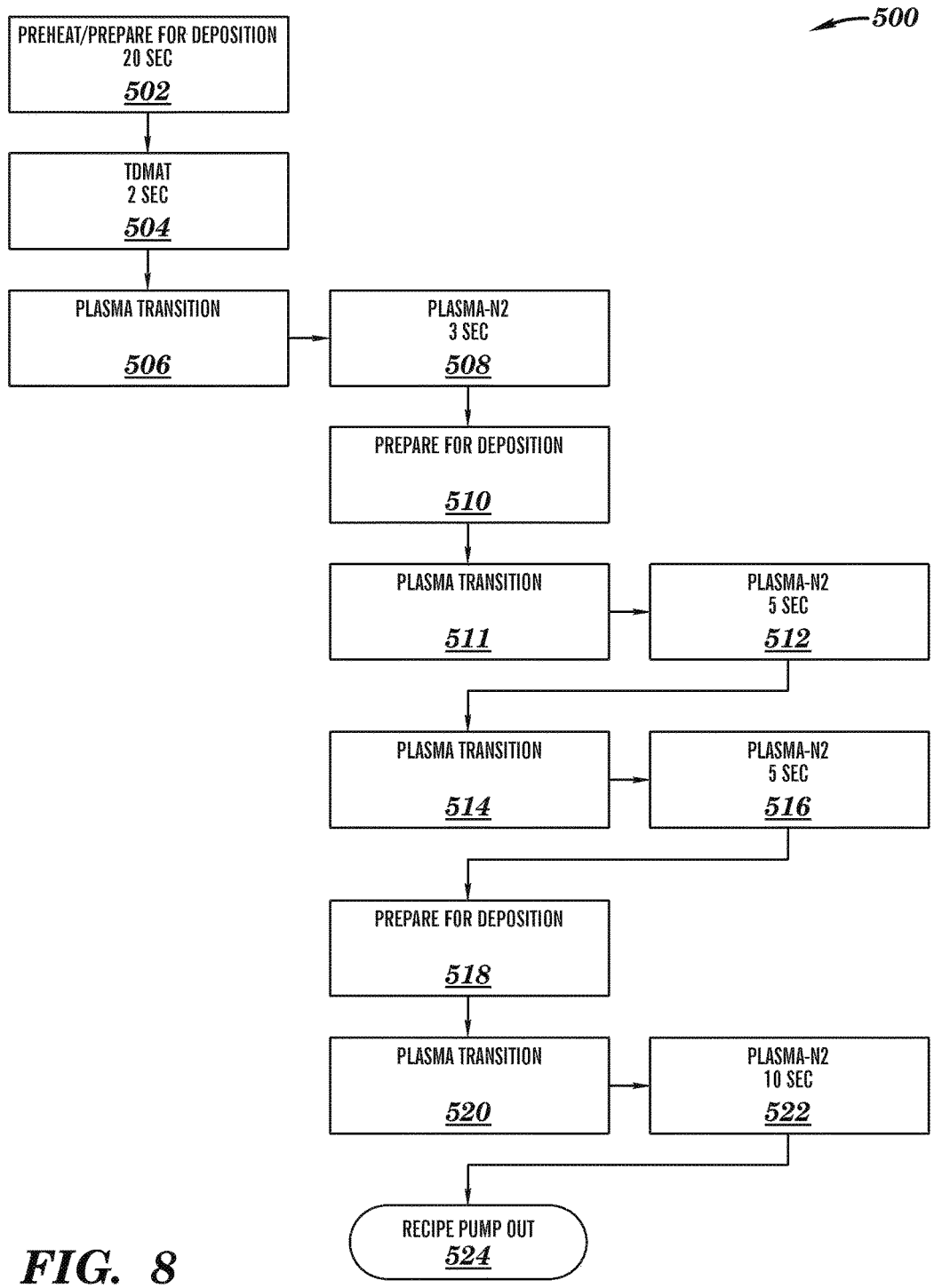
FIG. 8 is a flow chart describing processing steps during an atomic layer deposition process, according to an embodiment of the present disclosure.

Referring now to FIG. 8, a flow chart 500 describing an atomic layer deposition scheme for forming the diffusion barrier 46 (FIG. 4) is shown, according to an embodiment of the present disclosure. The present ALD scheme may differ from the one described in FIG. 7 since it may include only one pulse of the TDMAT precursor gas and numerous pulses of the nitrogen-rich plasma. Numerous pulses of the nitrogen rich plasma may not be typical in the art since they may generally be associated to non-uniformity of the titanium nitride film forming the diffusion barrier 46 (FIG. 4).

In this embodiment, the ALD process may begin at step 502 with a pre-heating step that may prepare the deposition surface or substrate to react with and chemisorb the TDMAT precursor gas introduced in the reaction chamber at step 504. In this embodiment, a single pulse of the TDMAT precursor gas may be introduced in the reaction chamber at step 504 having a duration of approximately 2 seconds. Then, at the plasma transition step 506, the reactor may be purged with an inert gas such as argon or helium, as described above, and may be followed by the plasma step 508 where a first nitrogen-rich plasma pulse of approximately 3 seconds may be applied to the deposition surface. It should be noted that between each cycle of nitrogen-rich plasma injection, a plasma transition step may take place to purge the reactor in preparation for deposition.

The process may continue with a preparation for deposition step 510 substantially similar to the preparation step 502. Then a plasma transition step 511, substantially similar to the plasma transition step 506, may be conducted. After the plasma transition step 511, a second nitrogen-rich plasma pulse may be injected at step 512 for approximately 5 seconds. The second nitrogen-rich plasma pulse at step 512 may be followed by another plasma transition at step 514 to purge the reactor. At step 516, a third pulse of nitrogen-rich plasma may be injected into the reactor for approximately 5 seconds. The process may continue with a preparation for deposition step 518 substantially similar to the preparation steps 502, 510. Then, a plasma transition step 520, substantially similar to the plasma transition steps 506, 511, 514, may take place. After step 520, a fourth pulse of nitrogen-rich plasma of approximately 10 seconds may be applied to the deposition surface at step 522. It should be noted that, in this embodiment, only one pulse of TDMAT precursor gas may be introduced into the reaction chamber as opposed to several pulses of TDMAT precursor gas. The process may end with the recipe pump out step 524.

In this embodiment, by applying a plurality of nitrogen-rich plasma pulses of different duration or different lengths at steps 508, 512, 516, and 522 the resistivity of the titanium nitride film forming the diffusion barrier 46 (FIG. 4) may be controlled simultaneously with its barrier properties. More specifically, the nitrogen-rich plasma pulses of increasing duration at steps 508, 512, 512, and 522 may provide a titanium nitride film with controlled nitrogen stoichiometry and reduced thickness in which the reactivity to fluorine may be inversely proportional to the duration of the pulses. As a result, a multi-layer diffusion barrier consisting of several layers of gradually decreasing levels of fluorine reactivity may be formed in the contact openings 24 (FIG. 4). Stated differently, the first nitrogen-rich plasma pulse of 3 seconds may form a sub-layer of high fluorine diffusivity, the second and third nitrogen-rich plasma pulses of 5 seconds may form another sub-layer of medium fluorine diffusivity, and the fourth nitrogen-rich plasma pulse of 10 seconds may form another sub-layer of the diffusion barrier 46 (FIG. 4) exhibiting low fluorine diffusivity. According to this embodiment, the high-medium-low diffusivity approach may reduce the resistivity of the titanium nitride film for performance improvement in the first deposition cycles (lower nitrogen concentration) while gradually increasing the duration of the nitrogen-rich plasma pulses to minimize fluorine diffusion (higher nitrogen concentration). In general, the longer the pulse, the resulting titanium nitride diffusion barrier 46 (FIG. 4) will be more resistant to reacting with fluorine owing to the increased nitrogen concentration.

As described above, by controlling the nitrogen stoichiometry in the Ti/TiN interface nucleation and densification of the titanium nitride film may be modified, allowing the formation of a substantially robust diffusion barrier 46 (FIG. 4) in fewer deposition cycles which may in turn reduce thickness while preventing fluorine diffusion.

Figure 9:
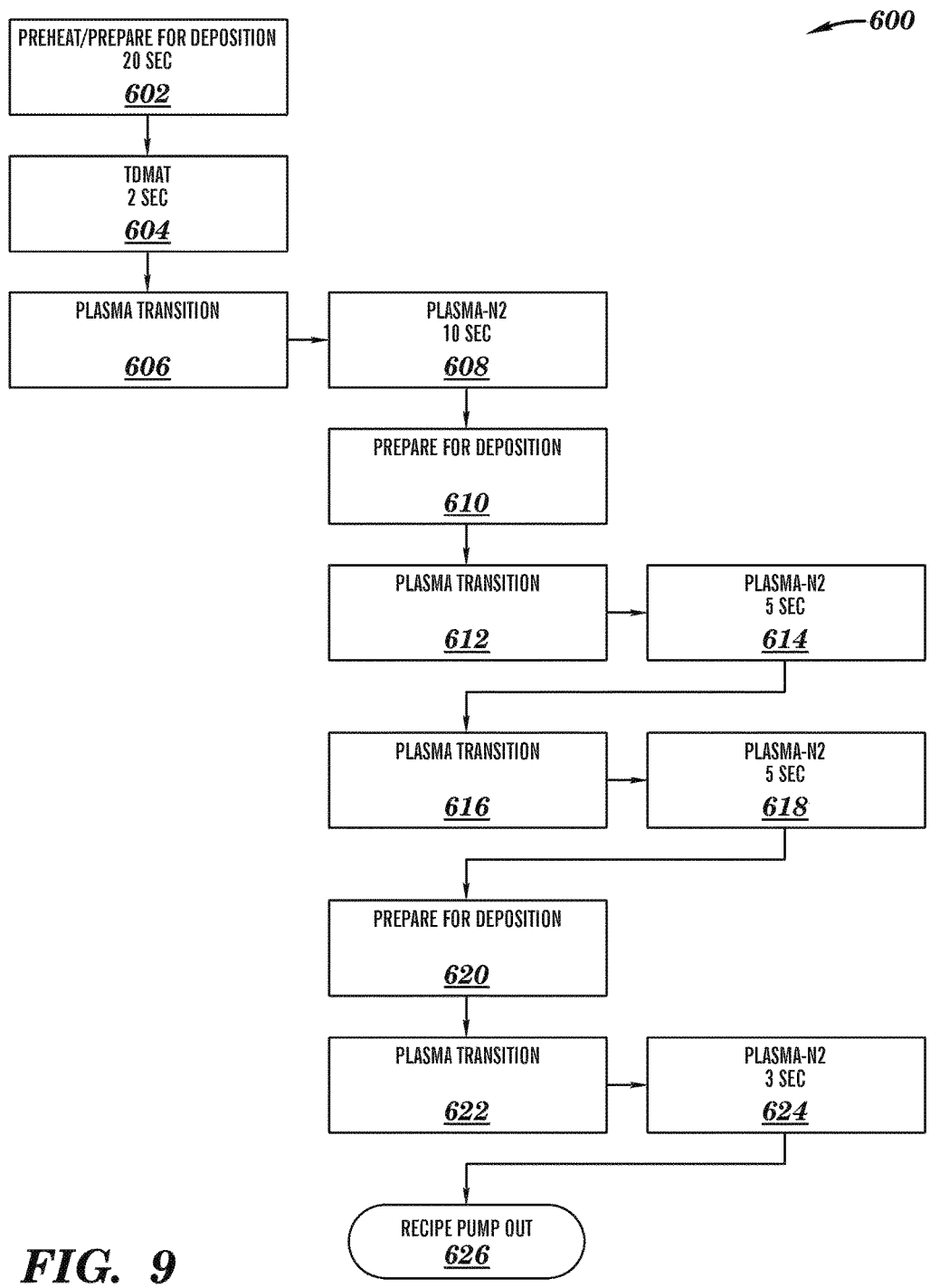
FIG. 9 is a flow chart describing processing steps during an atomic layer deposition process, according to an embodiment of the present disclosure.

Referring now to FIG. 9, a flow chart 600 describing an atomic layer deposition scheme for forming the diffusion barrier 46 (FIG. 4) is shown, according to an embodiment of the present disclosure. The present ALD scheme may differ from the one described in FIG. 7 since it may include only one pulse of the TDMAT precursor gas and numerous pulses of the nitrogen-rich plasma. Numerous pulses of the nitrogen rich plasma may not be typical in the art since they may generally be associated to non-uniformity of the titanium nitride film forming the diffusion barrier 46 (FIG. 4).

In this embodiment, the ALD process may begin at step 602 with a pre-heating step that may prepare the deposition surface or substrate to react with and chemisorb the TDMAT precursor gas introduced in the reaction chamber at step 604. In this embodiment, a single pulse of the TDMAT precursor gas may be introduced in the reaction chamber at step 604 having a duration of approximately 2 seconds. Then, at the plasma transition step 606, the reactor may be purged with an inert gas such as argon or helium, as described above, and may be followed by the plasma step 608 where a first nitrogen-rich plasma pulse of approximately 10 seconds may be applied to the deposition surface. It should be noted that between each cycle of nitrogen-rich plasma injection, a plasma transition step may take place to purge the reactor in preparation for deposition.

The process may continue with a preparation for deposition step 610 substantially similar to the preparation step 602. Then a plasma transition step 612, substantially similar to the plasma transition step 606, may be conducted. After the plasma transition step 612, a second nitrogen-rich plasma pulse may be injected at step 614 for approximately 5 seconds. The second nitrogen-rich plasma pulse at step 614 may be followed by another plasma transition at step 616 to purge the reactor. At step 618, a third pulse of nitrogen-rich plasma may be injected into the reactor for approximately 5 seconds. The process may continue with a preparation for deposition step 620 substantially similar to the preparation steps 602, 610. Then, a plasma transition step 622, substantially similar to the plasma transition steps 606, 612, 616, may take place. After step 622, a fourth pulse of nitrogen-rich plasma of approximately 3 seconds may be applied to the deposition surface at step 624. It should be noted that, in this embodiment, only one pulse of TDMAT precursor gas may be introduced into the reaction chamber as opposed to several pulses of TDMAT precursor gas. The process may end with the recipe pump out step 626.

In this embodiment, by applying a plurality of nitrogen-rich plasma pulses of different duration or different lengths at steps 608, 614, 618, and 624 the resistivity of the titanium nitride film forming the diffusion barrier 46 (FIG. 4) may be controlled simultaneously with its barrier properties. More specifically, the nitrogen-rich plasma pulses of decreasing duration at steps 608, 614, 618, and 624 may provide a titanium nitride film with controlled nitrogen stoichiometry and reduced thickness in which the reactivity to fluorine may be inversely proportional to the duration of the pulses. As a result, a multi-layer diffusion barrier consisting of several layers of gradually increasing levels of fluorine reactivity may be formed in the contact openings 24 (FIG. 4). Stated differently, the first nitrogen-rich plasma pulse of 10 seconds may form a sub-layer of low fluorine diffusivity, the second and third nitrogen-rich plasma pulses of 5 seconds may form another sub-layer of medium fluorine diffusivity, and the fourth nitrogen-rich plasma pulse of 3 seconds may form another sub-layer of the diffusion barrier 46 (FIG. 4) exhibiting high fluorine diffusivity. According to this embodiment, the low-medium-high diffusivity approach may increase the nitrogen concentration of the TiN film in the first deposition cycles to reduce fluorine diffusivity while the resistivity of the titanium nitride film is decreased in the last deposition cycles for performance improvement. In general, the longer the pulse, the resulting titanium nitride diffusion barrier 46 (FIG. 4) will be more resistant to reacting with fluorine owing to the increased nitrogen concentration.

As described above, by controlling the nitrogen stoichiometry in the Ti/TiN interface nucleation and densification of the titanium nitride film may be modified, allowing the formation of a substantially robust diffusion barrier 46 (FIG. 4) in fewer deposition cycles which may in turn reduce thickness while preventing fluorine diffusion.

The experimental conditions described in FIGS. 7, 8 and 9 may ensure the deposition of a dense titanium nitride barrier film, with a constant thickness increase in each deposition cycle. The self-limiting growth mechanism of the ALD process may enable the formation of conformal thin films with precise thickness on large areas and high aspect ratio features.

A titanium nitride diffusion barrier (e.g. diffusion barrier 46 in FIG. 4) deposited following a traditional ALD scheme may have a thickness varying from approximately 2 nm to approximately 5 nm and may effectively prevent fluorine diffusion only after a substantial thickness (approximately a >60% increase from a 2 nm thickness) has been reached. This may impose a penalty in contact and lateral resistance that may negatively affect both the performance and yield of a semiconductor device as a result of parasitic resistance. Additionally, massive hollow CA defectivity has been observed in MOL contacts when a traditional ALD deposition scheme is applied.

Conversely, experimental results have shown a reduction of approximately 30% in overall thickness of the diffusion barrier 46 (FIG. 4) when any of the ALD schemes proposed in FIGS. 7, 8 and 9 are applied. Furthermore, the alternate schemes described above with reference to FIGS. 7, 8 and 9 may allow a reduction of approximately 5% to approximately 10% in contact vertical resistance owing to the decrease in thickness which may also enable a reduction of approximately 10% to approximately 15% in wire resistance as more volume fraction of tungsten may be allowed during MOL contact formation.

Therefore, by applying nitrogen-rich plasma pulses of different durations, the nitrogen stoichiometry of a titanium nitride film may be controlled during an atomic layer deposition (ALD) process forming an enhanced titanium nitride diffusion barrier capable of preventing fluorine diffusion while lowering contact resistance. Also, the thickness of the titanium nitride diffusion barrier may be reduced due to the fewer deposition cycles required to achieve the enhanced (higher density and increased nitrogen concentration) properties in the deposited titanium nitride film. The reduction in fluorine diffusion may effectively decrease hollow CA defectivity in middle-of-the-line (MOL) contacts.

The duration or length of the nitrogen-rich plasma pulses may be tuned in order to modify the nitrogen stoichiometry of the ALD TiN film. An enhanced nitrogen content in a gradient fashion of a subset of the ALD pulses may serve to reduce the overall thickness of the titanium nitride diffusion barrier while fluorine diffusion may be concurrently contained. The single-pulsed scheme in FIG. 7 may enhance TiN nucleation and density, enabling the formation of a more robust diffusion barrier with substantially lower resistivity in fewer deposition cycles. The high-medium-low diffusivity approach described in FIG. 8 may reduce the resistivity of the titanium nitride film for performance improvement in the first deposition cycles and increase gradually the duration of the nitrogen-rich plasma pulses to minimize fluorine diffusion. The opposite may occur in the low-medium-high diffusivity configuration described in FIG. 9 in which the nitrogen concentration of the TiN film is increased in the first deposition cycles to reduce fluorine diffusivity while the resistivity of the titanium nitride film is decreased in the last deposition cycles for performance improvement.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

The invention claimed is:

1. A method of forming a titanium nitride diffusion barrier, the method comprising:
    exposing a deposition surface to a pulse of a titanium-containing precursor gas to initiate
    a nucleation of the titanium nitride diffusion barrier in the deposition surface, wherein the deposition surface comprises sidewalls and a bottom of a contact opening;
    exposing the deposition surface to a first pulse of a nitrogen-rich plasma to form a first titanium nitride layer with a first nitrogen concentration in the deposition surface;
    exposing the first titanium nitride layer to a second pulse of the nitrogen-rich plasma to form a second titanium nitride layer with a second nitrogen concentration directly above and in contact with the first titanium nitride layer;
    exposing the second titanium nitride layer to a third pulse of the nitrogen-rich plasma to form a third titanium nitride layer with a third nitrogen concentration directly above and in contact with the second titanium nitride layer; and
    exposing the third titanium nitride layer to a fourth pulse of the nitrogen-rich plasma to form a fourth titanium nitride layer with a fourth nitrogen concentration directly above and in contact with the third titanium nitride layer,
    wherein the first, second, third, and fourth titanium nitride layers form a multi-layer titanium nitride diffusion barrier exhibiting gradually decreasing levels of fluorine diffusivity, the fluorine diffusivity of the first, second, third, and fourth titanium nitride layers is inversely proportional to a duration of the first, second, third, and fourth pulses of nitrogen-rich plasma and to a nitrogen concentration of the first, second, third, and fourth titanium nitride layers.

2. The method of claim 1, wherein the fourth pulse has a substantially longer duration than the first pulse.

3. The method of claim 1, wherein the first, second, third, and fourth pulses have gradually increasing durations of approximately 3 seconds, 5 seconds, 5 seconds, and 10 seconds, respectively.

4. The method of claim 1, wherein the first, second, third, and fourth pulses comprise a relatively short and timed injection interval of the nitrogen-rich plasma.

5. The method of claim 1, wherein the pulse of the titanium-containing precursor gas have a duration of approximately 2 seconds.

6. The method of claim 1, wherein the first, second, third, and fourth pulses of the nitrogen-rich plasma causes nucleation and densification of the titanium nitride diffusion barrier to gradually increase to control a reactivity between fluorine and titanium during the last deposition cycles to prevent fluorine diffusion, and allows the formation of a thinner titanium nitride diffusion barrier for decreasing vertical resistance.

7. The method of claim 6, wherein causing the nucleation and densification of the titanium nitride diffusion barrier to gradually increase reduces the amount of deposition cycles required to form the titanium nitride diffusion barrier, and causes oxidation of the titanium nitride diffusion barrier to decrease.

8. The method of claim 1, further comprising:
    purging the reaction chamber with an inert gas before each of the first, second, third, and fourth pulses of the nitrogen-rich plasma.

* * * * *